(12) United States Patent
Curtis

(10) Patent No.: US 7,298,136 B1
(45) Date of Patent: Nov. 20, 2007

(54) MAGNETICALLY COUPLED ELECTRICAL TEST LEAD

(76) Inventor: Kevin Mark Curtis, 704 Maple St., Locust, NC (US) 29097

( * ) Notice: Subject to any disclaimer, the term of this patent is extended or adjusted under 35 U.S.C. 154(b) by 0 days.

(21) Appl. No.: 11/456,048

(22) Filed: Jul. 6, 2006

Related U.S. Application Data

(60) Provisional application No. 60/698,974, filed on Jul. 14, 2005, provisional application No. 60/696,540, filed on Jul. 6, 2005.

(51) Int. Cl.
*G01R 31/02* (2006.01)
*H01R 11/30* (2006.01)

(52) U.S. Cl. ............ 324/158.1; 324/754; 438/39

(58) Field of Classification Search ......... 324/158.1, 324/754, 761, 72.5; 439/782, 38–40
See application file for complete search history.

(56) References Cited

U.S. PATENT DOCUMENTS

| | | | | | |
|---|---|---|---|---|---|
| 4,390,232 | A | * | 6/1983 | Jamgotchian | 439/38 |
| 5,414,346 | A | * | 5/1995 | Mohan | 324/72.5 |
| 5,446,393 | A | * | 8/1995 | Schaefer | 324/754 |
| 5,779,487 | A | * | 7/1998 | Gatin | 439/39 |
| 6,069,479 | A | * | 5/2000 | Taicher et al. | 324/309 |
| 7,057,401 | B2 | * | 6/2006 | Blades | 324/713 |
| 7,109,700 | B2 | * | 9/2006 | Fazzina | 324/115 |
| 2005/0280429 | A1 | * | 12/2005 | Maxwell | 324/754 |
| 2006/0043959 | A1 | * | 3/2006 | Cavoretto | 324/72.5 |
| 2006/0145714 | A1 | * | 7/2006 | Cruz | 324/754 |

FOREIGN PATENT DOCUMENTS

WO    WO03090321 A1    10/2003

* cited by examiner

*Primary Examiner*—Ernest Karlsen
*Assistant Examiner*—Joshua Benitez
(74) *Attorney, Agent, or Firm*—Tillman Wright, PLLC; James D. Wright; Chad D. Tillman

(57) ABSTRACT

An electrical test lead includes an insulated electrical cable having a proximal end and a distal end, an electrical connector disposed at the proximal end of the cable and connected to a test instrument, and an electrically conductive magnetic probe disposed at the distal end. The probe is adapted to magnetically attach to a test point in an electrical system and to provide an electrical connection from the test point through the probe, the cable and the connector to the test instrument. Together, the test lead and the test instrument may be used as an electrical test kit. The test lead may further include an additional electrical test lead component magnetically attached, and electrically connected, to the electrically conductive magnetic probe and extending therefrom. An additional electrically conductive magnetic probe or a non-magnetic electrical connector may be disposed at the distal end of the additional electrical test lead component.

5 Claims, 15 Drawing Sheets

MAGNETICALLY COUPLED ELECTRICAL TEST LEAD

CROSS-REFERENCE TO RELATED APPLICATION

The present application is a nonprovisional of, and claims priority under 35 U.S.C. §119(e) to, U.S. Provisional Patent Application No. 60/696,540 filed Jul. 6, 2005, and U.S. Provisional Patent Application No. 60/698,974 filed Jul. 14, 2005, each of which is hereby incorporated herein by reference.

BACKGROUND OF THE PRESENT INVENTION

1. Field of the Present Invention

The present invention relates generally to electrical test leads, and in particular, to test leads that allow physical and electrical contact of test instruments to a device under test using a magnetic probe to connect to the device.

2. Background

Electricians, automotive technicians and other personnel are frequently required to use various test instruments to test electrical equipment and systems such as circuit panels, power supplies (including car batteries), automotive electronics, and the like. The test instruments may include digital multimeters, phase meters, oscilloscopes, and the like. Conventionally, testing the equipment requires connecting test leads to the test instrument and then establishing electrical contact between the opposite ends of the test leads and appropriate test points on the equipment under test. For this purpose, each test lead typically includes a first suitable electrical connector for connecting the lead to the test instrument and a second suitable electrical connector for making electrical contact with the test points on the equipment under test. Both electrical connectors are generally of conventional construction, with the first electrical connector often being a plug-type connector, such as a banana-type connector, and the second electrical connector being a test probe, a clip (such as an alligator clip or any of various other types of clips suitable for temporary attachment to the test point), or the like.

Often, the electrician, technician or other tester must hold the test instrument in one hand while he manipulates one of the test probes with his other hand, thus preventing him from carrying out any other activities (since both hands are occupied). Clip-type connectors may free one hand, but require a suitable attachment point in order to work.

Another issue faced by electricians and other testers is the frequent presence of potentially lethal voltages and currents that are present in and around the equipment under test. When using the test probes, or when trying to attach a clip to the equipment under test, the user thus faces the prospect of an electrical shock or even electrocution.

Thus, a need exists for a more convenient and potentially safer type of test lead that allows the operator to couple his test lead from his test instrument to a common (possibly ground) point on the equipment under test during the entire troubleshooting or other test exercise, with no other intervention from the operator except the initial placement of the electrical connector.

SUMMARY OF THE PRESENT INVENTION

It has been recognized that it would be advantageous to develop electrical cables/test leads using magnetic force at one end thereof to allow physical and electrical contact between electrical test equipment and an electrical test point. This type test leads would help eliminate the often needed physical manipulation of test leads by test personnel in the vicinity of possibly lethal voltages, allowing the test personnel to maintain a safe distance from the test equipment.

In accordance with an aspect of the present invention, an electrical test lead includes: an insulated electrical cable having a proximal end and a distal end, an electrical connector disposed at the proximal end of the cable, and an electrically conductive magnetic probe disposed at the distal end.

In a feature of this aspect, the electrical connector is adapted to connect to a test instrument, and the electrical connector may be a banana plug.

In another feature of this aspect, the electrically conductive magnetic probe is adapted to electrically connect to a test point of a piece of equipment to be tested. The magnetic probe may include a magnetic core and an outer insulating coating retaining and partially exposing the magnetic core therein. The magnetic core may include a piece of magnetic material, which may be neodymium iron boron, to which an electrically conductive metallic coating, which may be nickel, is applied. The partially exposed magnetic core may include a surface whose shape is selected from the group consisting of: flat surface, pointed surface, concave surface, convex surface, chisel surface, and round ball spherical surface.

In yet another feature of this aspect, the magnetic probe is adapted to be oriented at a 90 degree angle relative to a longitudinal axis of the cable.

In still another feature of this aspect, the electrical test lead further includes an additional electrical test lead component electrically connected to the electrically conductive magnetic probe and extending therefrom. The additional electrical test lead component has a proximal end and a distal end, wherein the proximal end of the additional electrical test lead component is magnetically attached and electrically connected to the electrically conductive magnetic probe, and wherein the distal end of the additional electrical test lead component is adapted to electrically connect to a test point of a piece of equipment to be tested. The additional electrical test lead component may be an electrical test lead extender adapted to extend the effective length of the electrical test lead, or it may be an electrical test lead adapter having a non-magnetic electrical connector disposed at the distal end thereof. The electrical test lead may further include an additional second electrically conductive magnetic probe is disposed at the distal end of the additional electrical test lead component. A test probe, an alligator clip or the like may be disposed at the distal end of the additional electrical test lead component.

In another feature of the additional electrical test lead component feature of this aspect, the additional electrical test lead component may comprise an electrically conductive connector disposed at the proximal end thereof and adapted to magnetically attach to the magnetic probe of the electrical test lead, thereby establishing an electrical connection. The electrically conductive connector may be a magnetic core, comprising a piece of magnetic material to which an electrically conductive metallic coating is applied, or the electrically conductive connector may be a ferrous metal slug that is adapted to magnetically attach to the electrically conductive magnetic probe of the electrical test lead.

In accordance with another aspect of the present invention, a method of conducting an electrical test on an electrical system includes: providing a test instrument; providing at least one electrical test lead having a proximal end and a distal end, an electrically conductive magnetic probe being disposed at the distal end; connecting the proximal end of the at least one electrical test lead to the test instrument; magnetically attaching the electrically conductive magnetic probe of the at least one electrical test lead to a test point in an electrical system, thereby retaining the magnetic probe at the test point, while maintaining an electrical connection from the test point in the electrical system, through the electrically conductive magnetic probe, to the test instrument; and using the test instrument to test an electrical parameter of the electrical system via the magnetically attached magnetic probe and the electrical connection maintained thereby.

In accordance with still another aspect of the present invention, an electrical test kit includes: a test instrument; and an electrical test lead, including an insulated electrical cable having a proximal end and a distal end, an electrical connector disposed at the proximal end of the cable and connected to the test instrument, and an electrically conductive magnetic probe disposed at the distal end, the probe adapted to magnetically attach to a test point in an electrical system and to provide an electrical connection from the test point through the probe, the cable and the connector to the test instrument.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
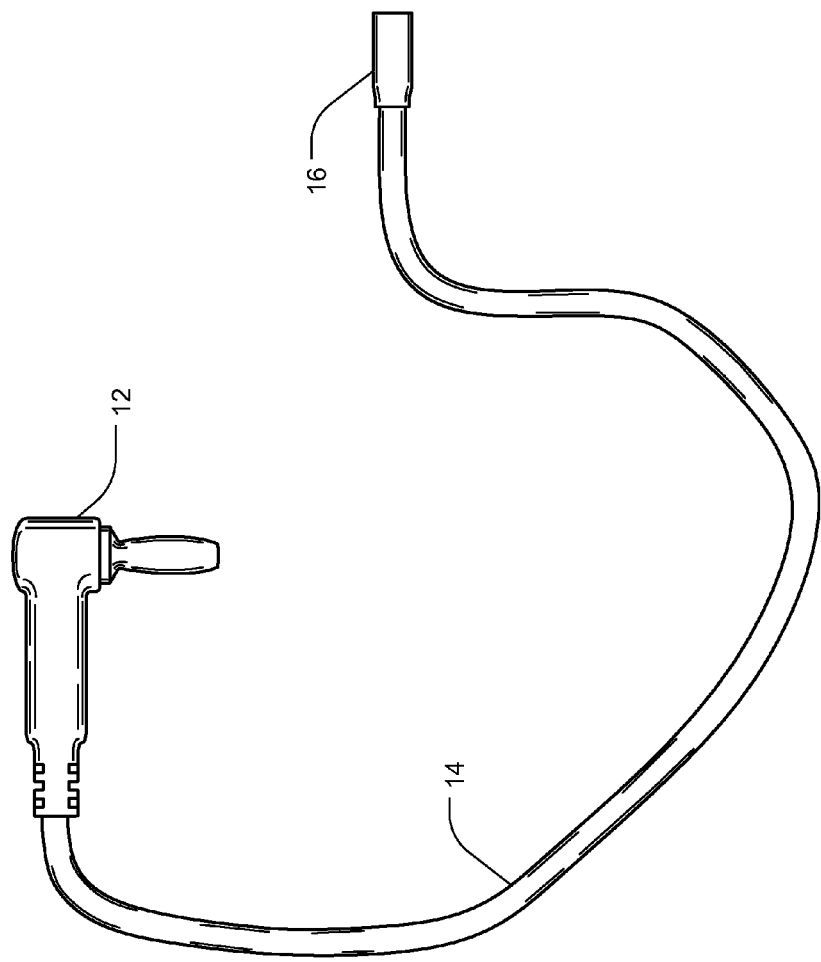
FIG. 1 is a perspective view of an electrical test lead in accordance with a preferred embodiment of the present invention.

As a preliminary matter, it will readily be understood by one having ordinary skill in the relevant art ("Ordinary Artisan") that the present invention has broad utility and application. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term-differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at lease one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers."Finally, when used herein to join a list of items, "and" denotes "all of the items of the list."Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 1 is a perspective view of an electrical test lead 10 in accordance with a preferred embodiment of the present invention. As shown therein, the electrical test lead 10 comprises an insulated electrical cable 14 having a proximal end and a distal end, with an electrical connector 12 disposed at the proximal end of the cable 14 and an electrically conductive magnetic probe 16 disposed at the distal end.

Figure 2B:
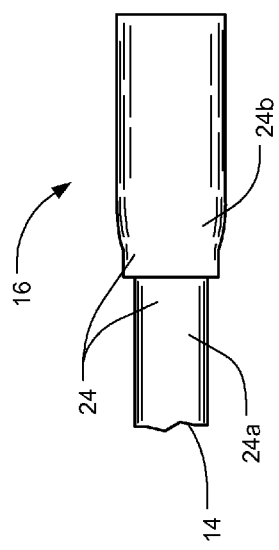
FIG. 2B is a side view of the magnetic probe of FIG. 2A.
Figure 3:
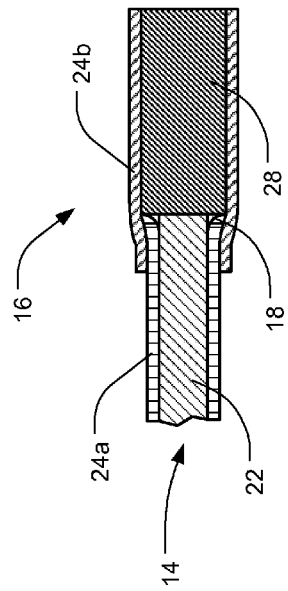
FIG. 3 is a side cross-sectional view of the magnetic probe of FIG. 2C, taken along line 3-3.
Figure 2A:
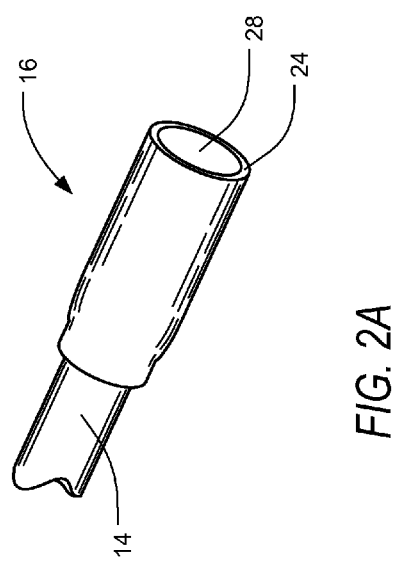
FIG. 2A is an enlarged perspective view of the magnetic probe of FIG. 1
Figure 2C:
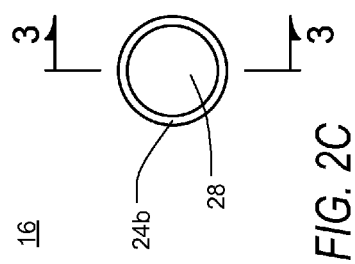
FIG. 2C is an end view of the magnetic probe of FIG. 2A.

FIGS. 2A-2C are a perspective, side and end view, respectively, of the magnetic probe 16 of FIG. 1, and FIG. 3 is a side cross-sectional view of the magnetic probe 16 of FIG. 2C, taken along line 3-3. As perhaps best shown in FIG. 2A, the magnetic probe 16 includes a partially exposed magnetic core 28 retained within an outer insulating coating 24. The magnetic core 28 is fabricated of an electrically conductive magnetized metal and has any suitable shape and configuration, but more preferably a generally cylindrical configuration. More particularly, the magnetic core 28 is fabricated from a piece of magnetic material to which an electrically conductive metallic coating or plating is applied. A magnetic material suitable for use in the preferred embodiments of the present invention is neodymium iron boron, but other magnetic or magnetizable materials may likewise be utilized. An electrically conductive metallic coating or plating suitable for use in the preferred embodiments of the present invention is nickel, but copper, gold and other types of electrically conductive materials that may be coated or plated onto the magnetic material may likewise be utilized.

The insulating coating 24 is formed from any suitable insulating material and provides a shield that prevents the magnetic probe 16 from being short-circuited when disengaged from a live test point. Suitable insulating materials may include, but are not limited to, heat shrinkable plastic or molded thermoplastic, e.g., a resin, a nylon, and/or blends thereof.

As shown in FIG. 3, the insulated electrical cable 14 comprises a conductive wire 22 that is likewise covered with an outer insulating coating 24. The distal end of the electrical cable 14 is electrically and mechanically attached to the magnetic core 28 by a solder connection 18. Care should be exercised during the soldering process in order to not exceed the critical temperature at which magnets lose their magnetic properties. Further, conventional strain relief means (not shown) may be provided for mechanically reinforcing the solder connection 18 between the conductive wire 22 and the magnetic core 28.

Figure 6:
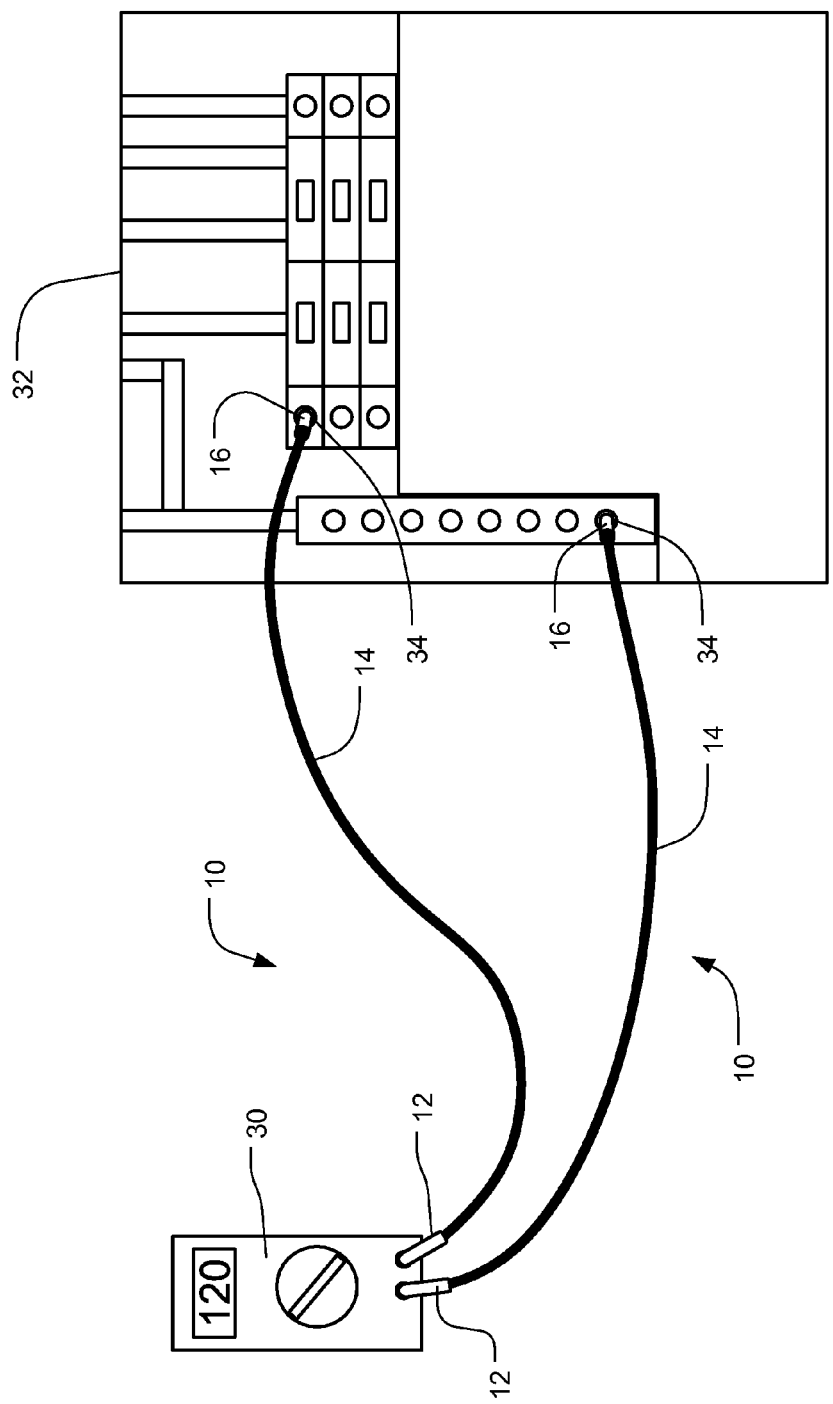
FIG. 6 is a schematic illustration of the test lead of FIG. 1 being used with a test instrument and a piece of equipment to be tested.

The magnetic probe 16 may be of any suitable size and shape to accommodate the space requirements of a device under test 32 (a representation of which is shown in FIG. 6). Moreover, during fabrication, the magnetic probe 16 may be adapted to be oriented at various angles relative to a longitudinal axis of the conductive wire 22. For example, although as shown the magnetic probe 16 is generally coaxial with the conductive wire 22, it will be understood that the magnetic probe 16 may instead be mounted at a 90 degree angle, i.e., perpendicularly, relative to the longitudinal axis of the conductive wire 22.

Figure 4:
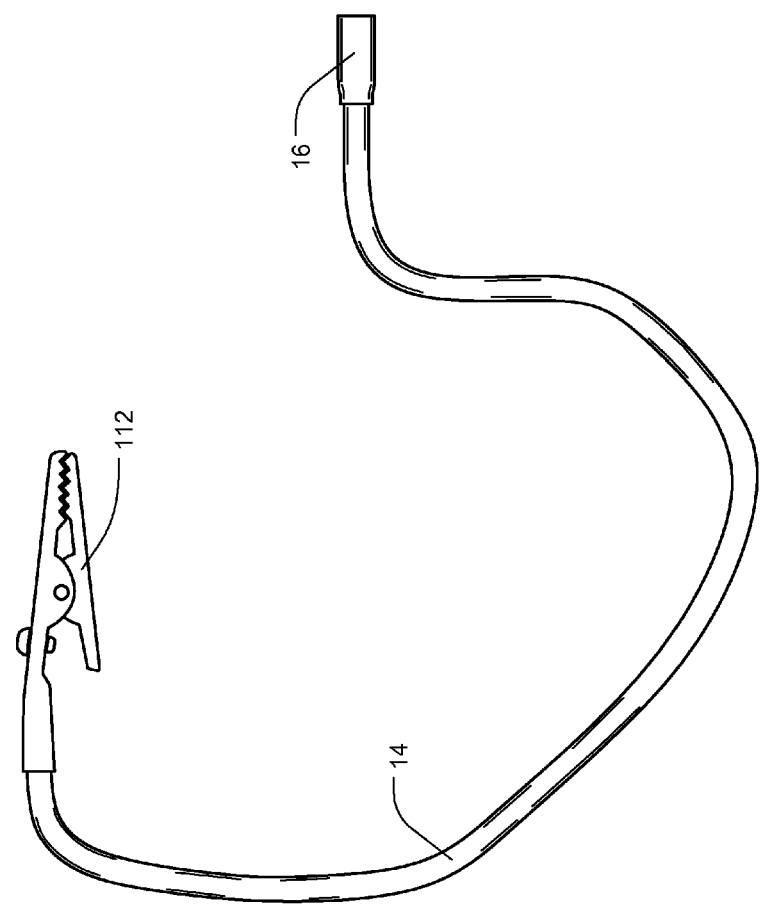
FIG. 4 is a perspective view of an electrical test lead in accordance with another preferred embodiment of the present invention.

The electrical connector 12 attached to the proximal end of the electrical cable 14 may generally be any electrical connector, and is preferably non-magnetic electrical connector 12 of conventional design and construction. Suitable non-magnetic electrical connectors include, but are not limited to, a banana clip, an alligator clip and any other type of clip, probe or the like. For example, FIG. 4 is a perspective view of an electrical test lead 110 in accordance with another preferred embodiment of the present invention. The test lead 110 of FIG. 4 includes a conventional alligator clip 112 as the electrical connector at the end of the cable 14 opposite the magnetic probe 16. The electrical connectors 12, 112 are typically used to attach to a piece of test equipment 30 (shown in FIG. 6). Test equipment 30 may be any type of conventional test equipment, including, but not limited to, test instruments such as digital multimeters, oscilloscopes, phase rotation indicators, and the like.

Figure 5B:
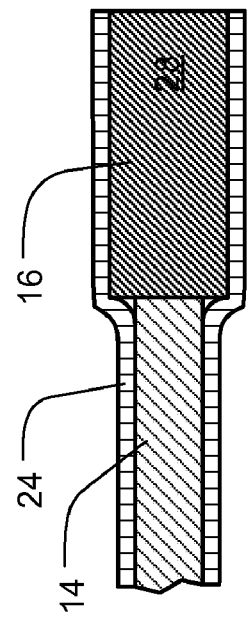
FIGS. 5A and 5B are a side view and a side cross-sectional view, respectively, of an alternative application of insulating coating.
Figure 5A:
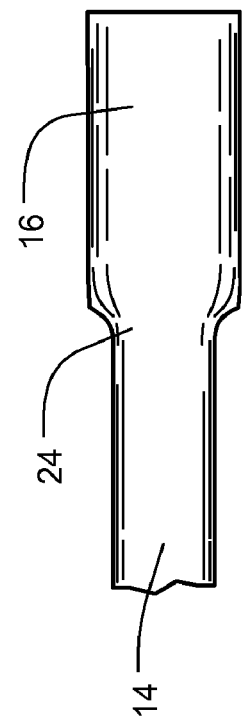

Referring again to FIG. 3, the insulating coating 24 covers the extent of the conductive wire 22, the solder connection 18 and the magnetic probe 16, with only an unsoldered end of the magnetic core 28 being exposed. In a preferred embodiment, the insulating coating 24 includes two portions 24a, 24b, with a first portion 24a covering the conductive wire 22 and the solder connection 18 and a second portion 24b covering the magnetic core 28. Alternatively, however, the insulating coating 24 may comprise a single piece of insulating material extending along the conductive wire 22, the solder connection 18 and the length of the magnetic probe 16, leaving exposed the one unsoldered end of magnetic core 28. FIGS. 5A and 5B are a side view and a side cross-sectional view, respectively, of such an alternative application of the insulating coating 24.

FIG. 6 is a schematic illustration of the test lead 10 of FIG. 1 being used with a test instrument 30 and a piece of equipment 32 to be tested. As used herein, an "electrical test kit" refers to one or more test leads, of any of the types described and/or illustrated herein, in combination with a test instrument. In use, a technician may attach two of the test leads 10 between a test instrument 30 and a piece of equipment under test 32. In FIG. 6, the test instrument 30 is a digital multimeter and the equipment to be tested 32 is an electrical breaker panel with a plurality of individual circuit breakers. Additional examples of equipment under test 32 may include power sources, car batteries, and the like. The respective magnetic probes 16 are magnetically attached by the technician to test points 34, and the necessary tests are conducted. After testing is complete, the electrical connection between the test points 34 and the magnetic probes 16 may be broken by moving a magnetic probe 16 in a lateral direction relative to a test point 34 with which it is in contact.

Although not specifically illustrated, one particularly useful application for the various preferred embodiments of the present invention is in the field of automotive repair. Conventionally, when testing most automotive electrical systems, the technician uses the vehicle chassis to establish a reference ground when making readings. Because the chassis is typically made from a ferrous metal, magnetic attachment of the probes 16 to the chassis is easy and convenient to accomplish. The probes 16 may also be conveniently attached to the metal bolts of the vehicle's battery terminals and the like.

Figure 7A:
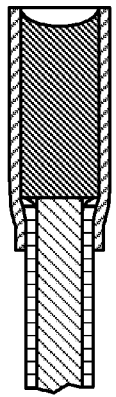
FIGS. 7A-7G are side cross-sectional views of alternative embodiments of a magnetic probe.
Figure 7B:
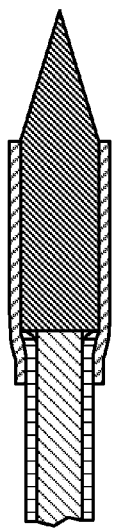
Figure 7C:
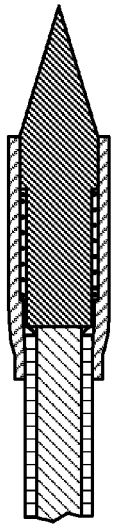
Figure 7D:
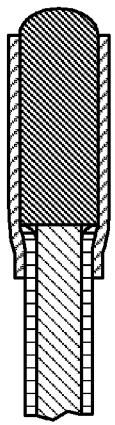
Figure 7E:
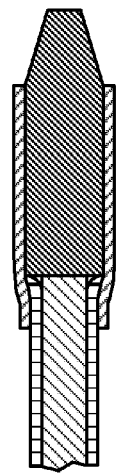
Figure 7F:
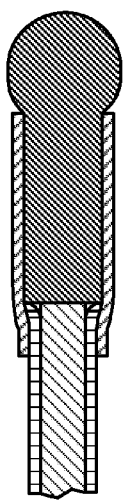
Figure 7G:
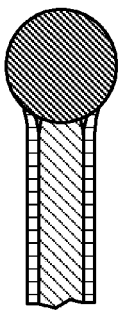

FIGS. 7A-7G are side cross-sectional views of alternative embodiments of the magnetic probe 16. The magnetic probe 16 may have a different configuration depending on its intended use. Alternative embodiments include, but are not limited to, magnetic probes that have the surface of the exposed unsoldered end thereof shaped as follows: concave (FIG. 7A), pointed (FIG. 7B), pointed with spring (FIG. 7C), convex (FIG. 7D), chisel (FIG. 7E), ball (FIG. 7F) and spherical (FIG. 7G).

Advantageously, the magnetic probe 16 of the electrical test lead 10 allows a user to connect a test instrument 30 to the equipment under test 32 without any need to reconnect the magnetic probe 16 once securely attached to the equipment under test 32 while conducting the necessary tests. The magnetic force applied by the magnetic core 28 temporarily retains the probe 16 against the test point 34 and thus may be left alone once placed by the user. Therefore, the physical manipulation of test leads by test personnel may be greatly reduced and in some cases eliminated.

Figure 8:
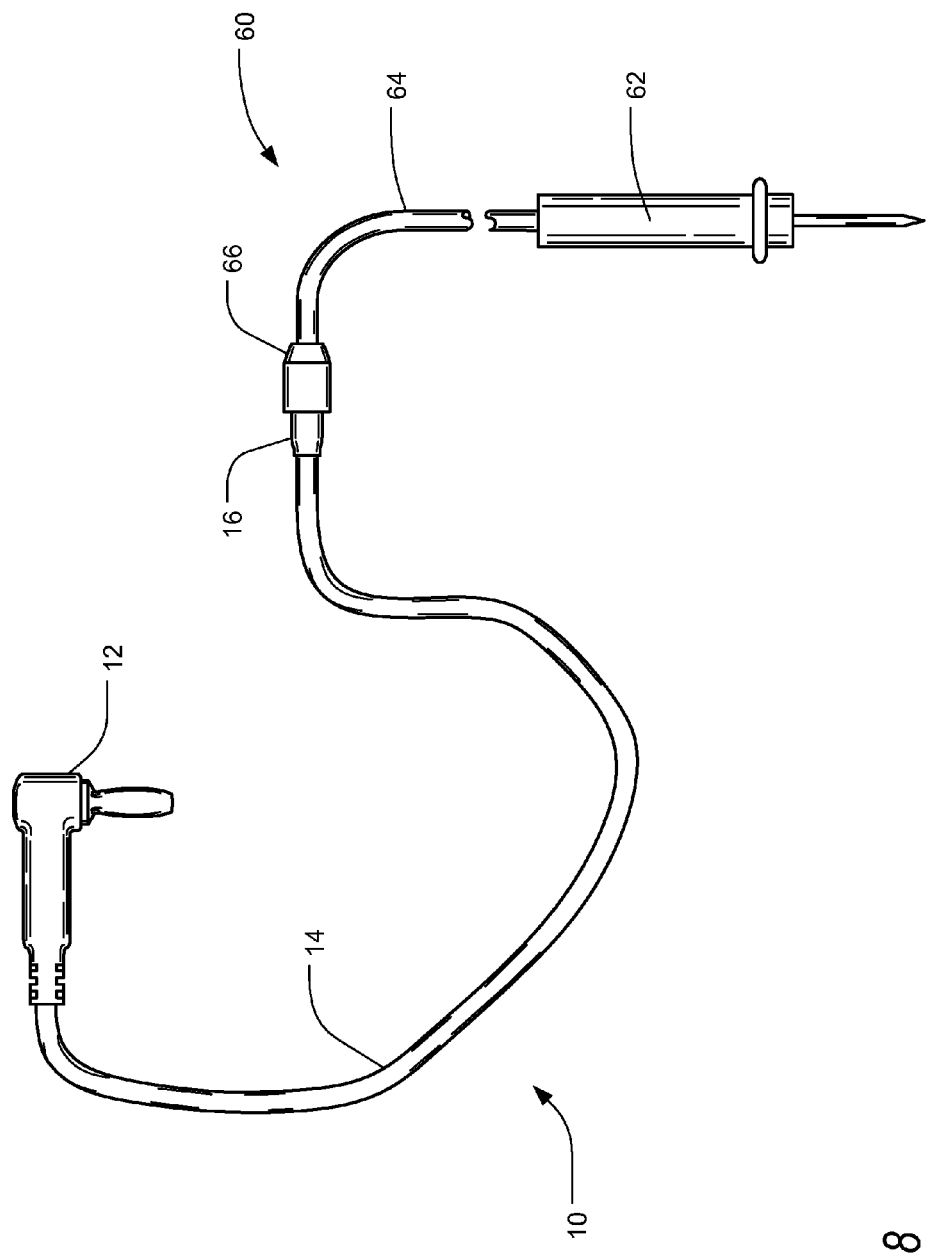
FIG. 8 is a perspective view of the electrical test lead of FIG. 1 incorporated into a convertible test lead in accordance with another preferred embodiment of the present invention.

FIG. 8 is a perspective view of the electrical test lead 10 of FIG. 1 incorporated into a convertible test lead 100 in accordance with another preferred embodiment of the present invention. In the convertible test lead 100, the test lead 10 of FIG. 1 is connected to an electrical test lead adapter 60 that includes a second insulated electrical cable 64 having a second magnetic probe 66 at its proximal end and a test probe or other electrical connector 62 at its distal end. The connection between the electrical test lead 10 of FIG. 1 and the electrical test lead adapter 60 forms a magnetically-coupled convertible test lead 100.

Figure 9A:
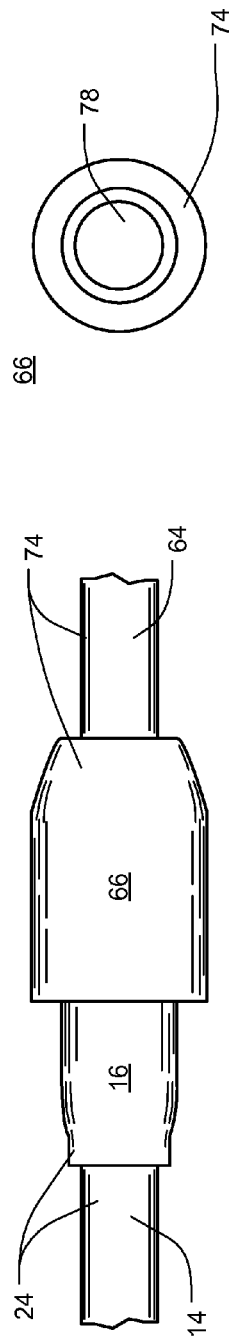
FIG. 9A is a side perspective view of the magnetic coupling of the convertible test lead of FIG. 8.
Figure 9B:
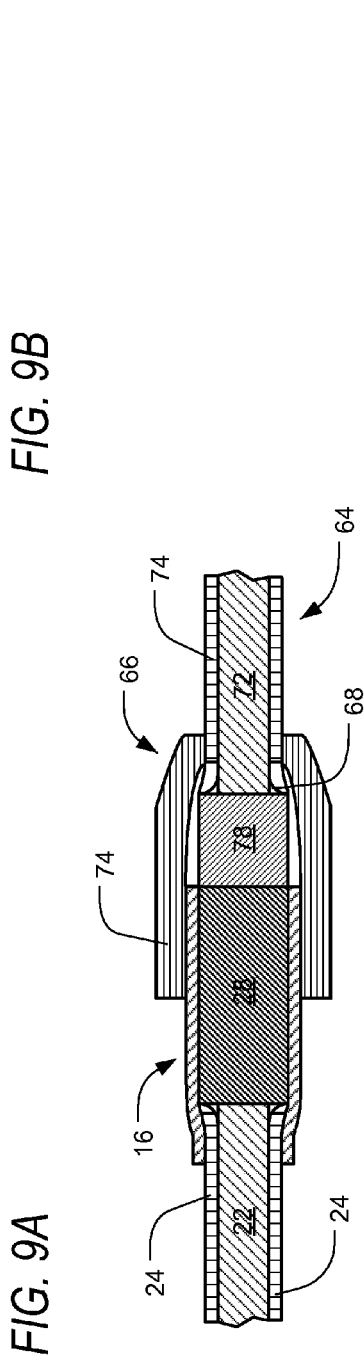
FIG. 9B is an end perspective view of the second magnetic probe of FIG. 9A.
Figure 10:
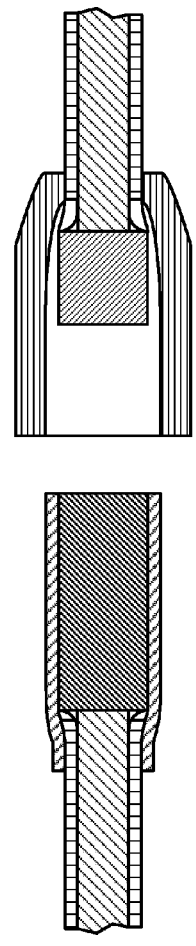
FIG. 10 is a side cross-sectional view of the magnetic coupling of FIG. 9A, shown in an engaged state.
Figure 11:
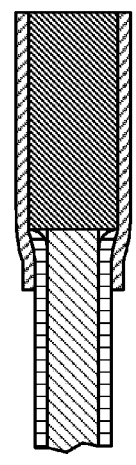
FIG. 11 is a side cross-sectional view of the magnetic coupling of FIG. 9A, shown in a disengaged state.

FIG. 9A is a side perspective view of the magnetic coupling of the convertible test lead 100 of FIG. 8; FIG. 9B is an end perspective view of the second magnetic probe 66 of FIG. 9A; and FIGS. 10 and 11 are side cross-sectional views of the magnetic coupling of FIG. 9A, shown in an engaged and a disengaged state, respectively. In at least one embodiment, it is preferred that one magnetic probe 16,66 be larger in size than the other magnetic probe 16,66. In the exemplary embodiment illustrated herein, the second magnetic probe 66 is larger than the first magnetic probe 16, but it will be understood that the relative sizes of the corresponding magnetic probes 16,66 may alternatively be reversed. Like the magnetic probe 16 of the test lead 10 of FIG. 1, the second magnetic probe 66 comprises a cylindrical magnetic core 78 substantially covered by an insulating coating 74 that may be formed from the same material as the insulating coating 24 of the test lead 10 of FIG. 1. Like the cable 14 of the test lead 10 of FIG. 1, the second electrical cable 64 comprises a conductive wire 72 that is likewise covered with an outer insulating coating 74. The proximal end of the second electrical cable 64 is electrically and mechanically attached to the magnetic core 78 by a solder connection 68, and once again, care should be exercised during the soldering process in order to not exceed the critical temperature at which magnets lose their magnetic properties. Further, conventional strain relief means (not shown) may be provided for mechanically reinforcing the solder connection 68 between the conductive wire 72 and the magnetic core 78.

As described previously, the unsoldered ends of the magnetic cores 28,78 are left uncovered by the insulating coating 74. In at least one embodiment, it is preferred that the magnetic core 78 of the larger magnetic probe 66 not extend to an inner surface of the insulating coating 74 surrounding it. This arrangement allows the smaller magnetic probe 16 to fit in concentric sliding relation within the insulating coating 74 of the larger magnetic probe 66 without interference from the insulating coating 24 of the smaller magnetic probe 16. In an alternative embodiment (not shown), the magnetic core 28,78 of each magnetic probe 16,66 extends to the respective inner surface of the insulating coating 24,74. In either arrangement, the exposed ends of the magnetic cores 28,78 may be brought into physical contact with one another, thereby establishing a magnetic connection therebetween. It will be understood that in order to facilitate this magnetic connection, the polarities of the respective magnetic cores 28,78 must be arranged to create attractive forces therebetween.

When the magnetic probes 16,66 are brought into physical contact, the two probes 16,66 engage in a magnetic bond, and a low resistance electrical path is created therebetween. Therefore, when electrical test leads having the magnetic coupling are utilized, a low resistance electrical path is created between a test instrument 30 and a device under test 32, passing through the first electrical cable 14, through the first magnetic probe 16, through the second magnetic probe 66 and on through the second electrical cable 64, wherein the cables 14,64 are connected to the test instrument 30 and the device under test 32 by means of appropriate electrical connectors 12,112.

In use, the magnetically coupled electrical connector is helpful for connecting, for example, a typical test probe 62 that is used on a device under test 32 to a test lead 10 that attaches to a test instrument, as a temporary means for releasing the test lead adapter 60 (and thus the test probe 62) quickly from the device under test 32 and replacing it with a lead having a different electrical connector, such as an alligator clip 112. To disengage the test lead adapter 60 from the test lead 10 that is joined by a magnetically-coupled electrical connector, a user simply pulls at either side of the magnetic connection to overcome the magnetic attraction of the two magnetic probes 16,56. With such a magnetic coupling, the user can replace an adapter 60 with a test probe 62 such as the one shown in FIG. 8 with any other adapter, having a different electrical connector, for conducting the necessary tests.

In at least some embodiments that may be preferred for their reduced manufacturing cost, the magnetic core 78 may be replaced by an electrically conductive ferrous metal slug. Although when coupled with the magnetic core 28 of the first probe 16, a magnetic bond may still be achieved by bringing the metal slug into contact with the magnetic core 28 of the first probe 16. Such an alternative design could not be used as a magnetic probe because the slug itself would have little or no magnetic properties, but would be generally sufficient to maintain the coupled connection with the magnetic core 28 of the first probe 16. Such a slug could further be substituted in many of the other leads described and/or illustrated herein, with a similar potential reduction in manufacturing cost but a similar reduction in reliability and functionality.

Figure 12:
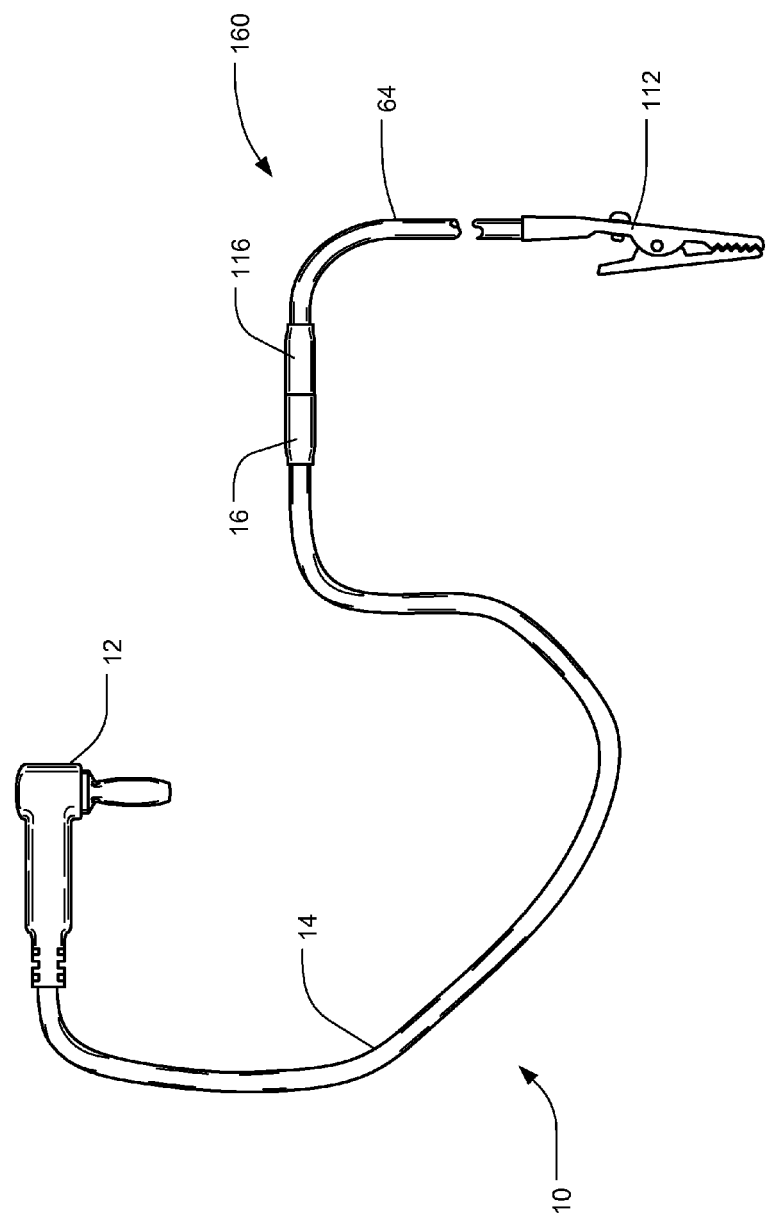
FIG. 12 is a perspective view of the electrical test lead of FIG. 1 incorporated into another convertible test lead in accordance with another preferred embodiment of the present invention.
Figure 13A:
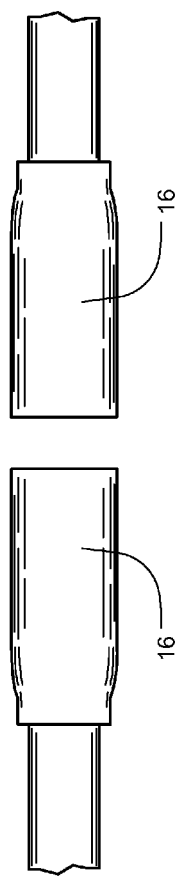
FIG. 13A is a side perspective view of the two magnetic probes of FIG. 12, shown in a disengaged state.
Figure 13B:
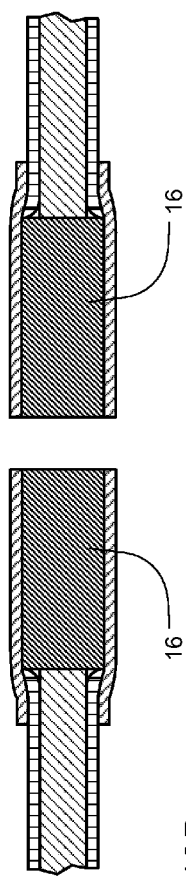
FIG. 13B is a side cross-sectional view of the two magnetic probes of FIG. 12, shown in a disengaged state.
Figure 13C:
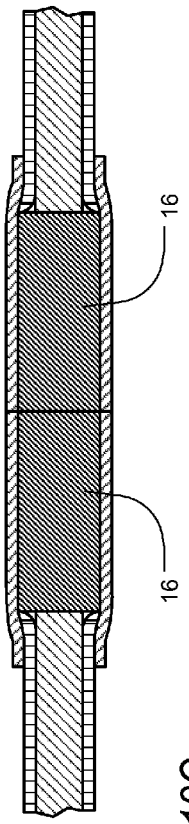
FIG. 13C is a side cross-sectional view of the two magnetic probes of FIG. 12, shown in an engaged state.

FIG. 12 is a perspective view of the electrical test lead 10 of FIG. 1 incorporated into another convertible test lead 200 in accordance with another preferred embodiment of the present invention. Like the convertible test lead 100 of FIG. 8, this convertible test lead 200 includes the test lead 10 of FIG. 1 connected to an electrical test lead adapter 160 that includes a second insulated electrical cable 64 having a second magnetic probe 116 at its proximal end and an electrical connector 112 at its distal end. Once again, the connection between the electrical test lead 10 of FIG. 1 and the electrical test lead adapter 160 forms a magnetically-coupled convertible test lead 200. Other than the inclusion of an alternative type of electrical connector 112 (in this case, an alligator clip), the test lead adapter 160 of FIG. 12 is similar to that of FIG. 8 except that the second magnetic probe 116 is somewhat different in construction. More particularly, the second magnetic probe 116 is similar to the magnetic probe 16 of the first test lead 10, except that its magnetic core 28 is reversed in polarity in order to produce the necessary attractive forces between the respective magnetic cores 28,28. The connection between the two magnetic probes 16,16 is illustrated in FIGS. 13A-13C, which are a side perspective view of two disengaged magnetic probes 16,16, a side cross-sectional view of two disengaged magnetic probes 16,16, and a side cross-sectional view of two engaged magnetic probes 16,16, respectively. This test lead adapter 160 is thus an example of the type of test lead adapter with which the test lead adapter 60 of FIG. 8 may be replaced as desired by the user. Notably, the first test lead 10 is adapted to mate with either the magnetic probe 66 of the first exemplary test lead adapter 60 or the second exemplary test lead adapter 160.

Figure 14:
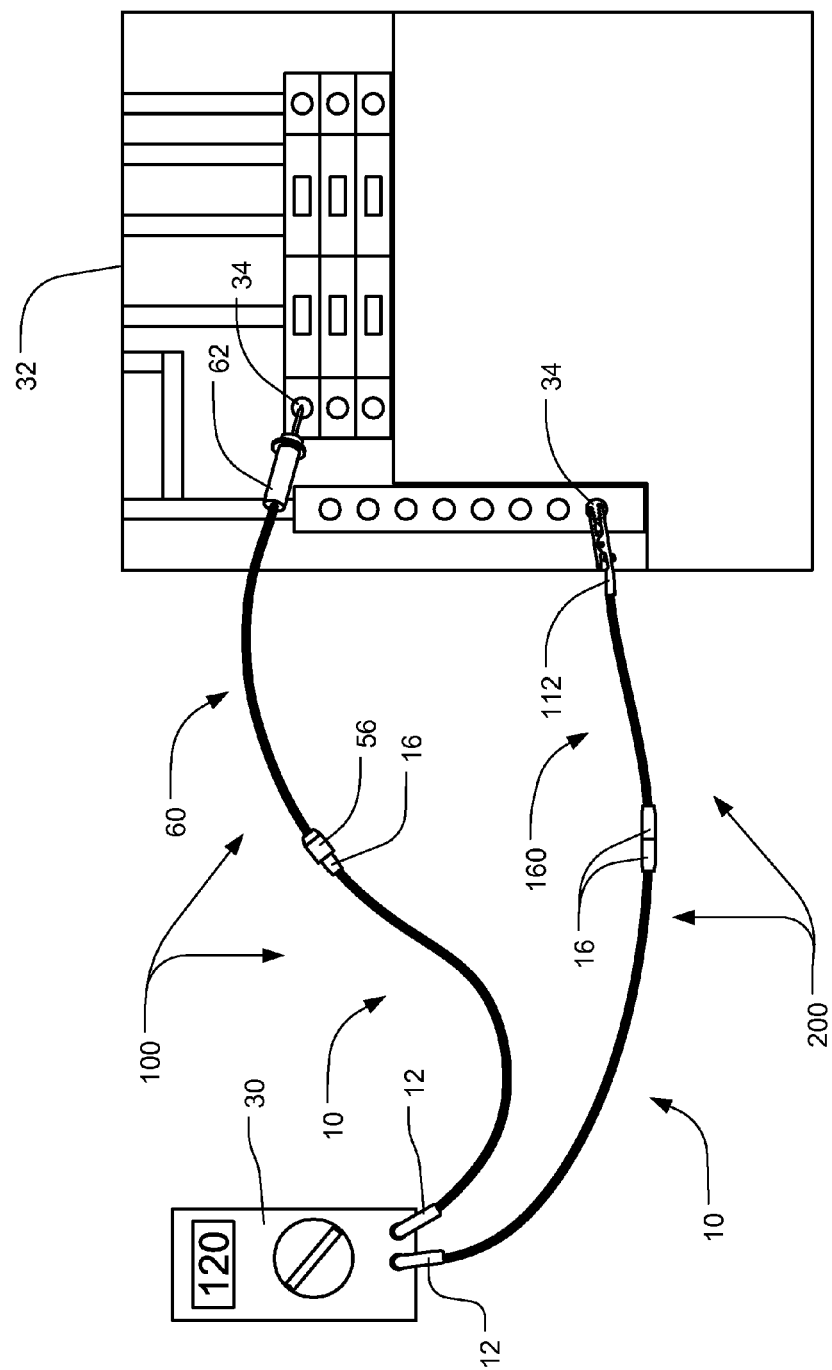
FIG. 14 is a first schematic illustration of some of the various configurations of the test leads of FIGS. 1, 4, 8 and 12.

It will be understood that various configurations of test leads 10,100,200 may be used during testing of a device 32. FIG. 14 is a first schematic illustration of some of these variations. As shown therein, a technician may attach the test instrument 30 to, for example, an electrical breaker panel 32 using one convertible test lead 100 of the type shown in FIG. 8, and a second convertible test lead 200 of the type shown in FIG. 12. The two illustrated test lead adapters 60,160 are interchangeable, and the particular test lead adapter 60,160 chosen may be based on the nature of the test point 34. In this configuration, each convertible test lead 100,200 is being used conventionally in that their respective magnetic couplings are engaged and the test probe 62 and alligator clip 112 are being used conventionally (i.e., non-magnetically).

Figure 15:
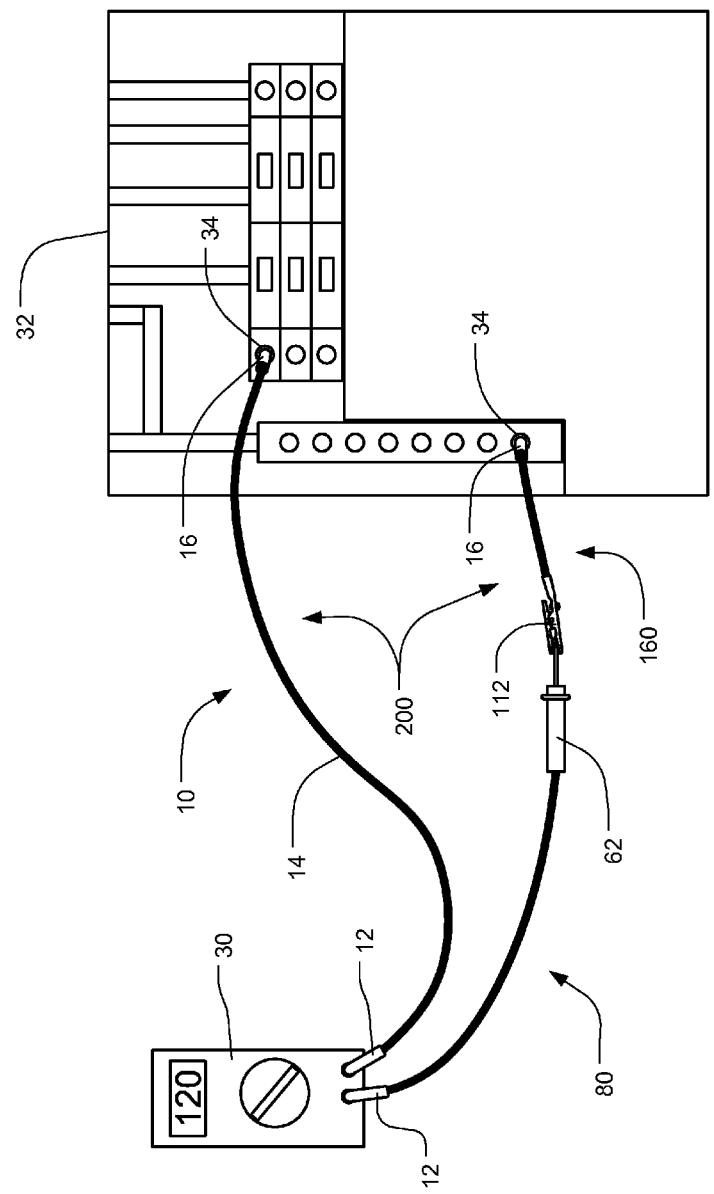
FIG. 15 is a second schematic illustration of some of the various configurations of the test leads of FIGS. 1, 4, 8 and 12.

Significantly, the first test lead 10 of each convertible test lead 100,200 may also be used separately by directly attaching its magnetic probe 16 to a device under test 32 if the test points on such device 32 have a ferrous metal surface. This is illustrated in FIG. 15, which is a second schematic illustration of some additional configuration variations. As shown therein, a technician may alternatively attach the test instrument 30 to the electrical breaker panel 32 using the components of one convertible test lead 200 of the type shown in FIG. 12, and a second test lead 80 of conventional construction, wherein the conventional test lead 80 includes a conventional, non-magnetic electrical connector at each end with no magnetic coupling interposed therebetween. The convertible test lead 200 has been separated into a first test lead 10, of the type shown in FIG. 1, and the test lead adapter 160, of the type shown in FIG. 12. When separated, each lead 10,160 has a magnetic probe 16 at one end and a non-magnetic electrical connector 12,112 at the other end. One of the electrical connectors of the conventional test lead 80 is connected to the test instrument 30, while the other electrical connector of the conventional test lead 80 is connected to the electrical connector 112 of the test lead adapter 160. The magnetic probe 16 of the other end of the test lead adapter 160 is connected to a test point 34 on the device under test 32. Finally, the first test lead 10 is used in the same way illustrated in FIG. 6.

Figure 16:
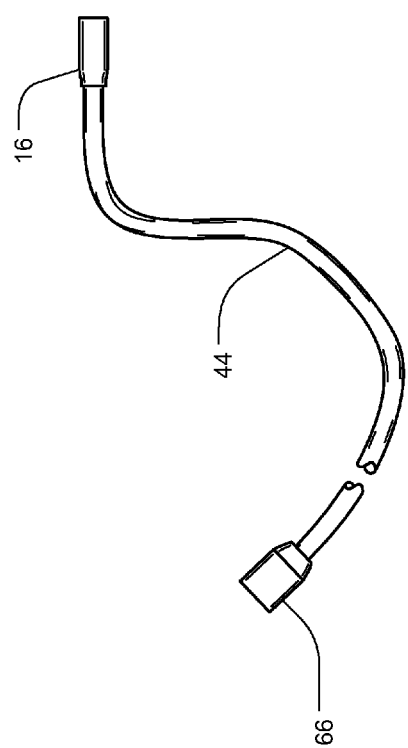
FIG. 16 is a perspective view of an electrical test lead extender in accordance with another preferred embodiment of the present invention.

FIG. 16 is a perspective view of an electrical test lead extender 40 in accordance with another preferred embodiment of the present invention. As shown therein, the electrical test lead extender 40 comprises an insulated electrical cable 44 having a proximal end and a distal end, with one type of electrically conductive magnetic probe 66 disposed at the proximal end of the cable 44 and another type of electrically conductive magnetic probe 16 disposed at the distal end. It will be apparent that other types of probes may be substituted for either probe, and that in fact the two probes may be of the same type, but the two probes 16, 66 preferably are arranged to have opposite polarities for a purpose made evident below. The construction of the cable 44 and the two probes 16, 66 may be identical to those described previously.

Figure 17:
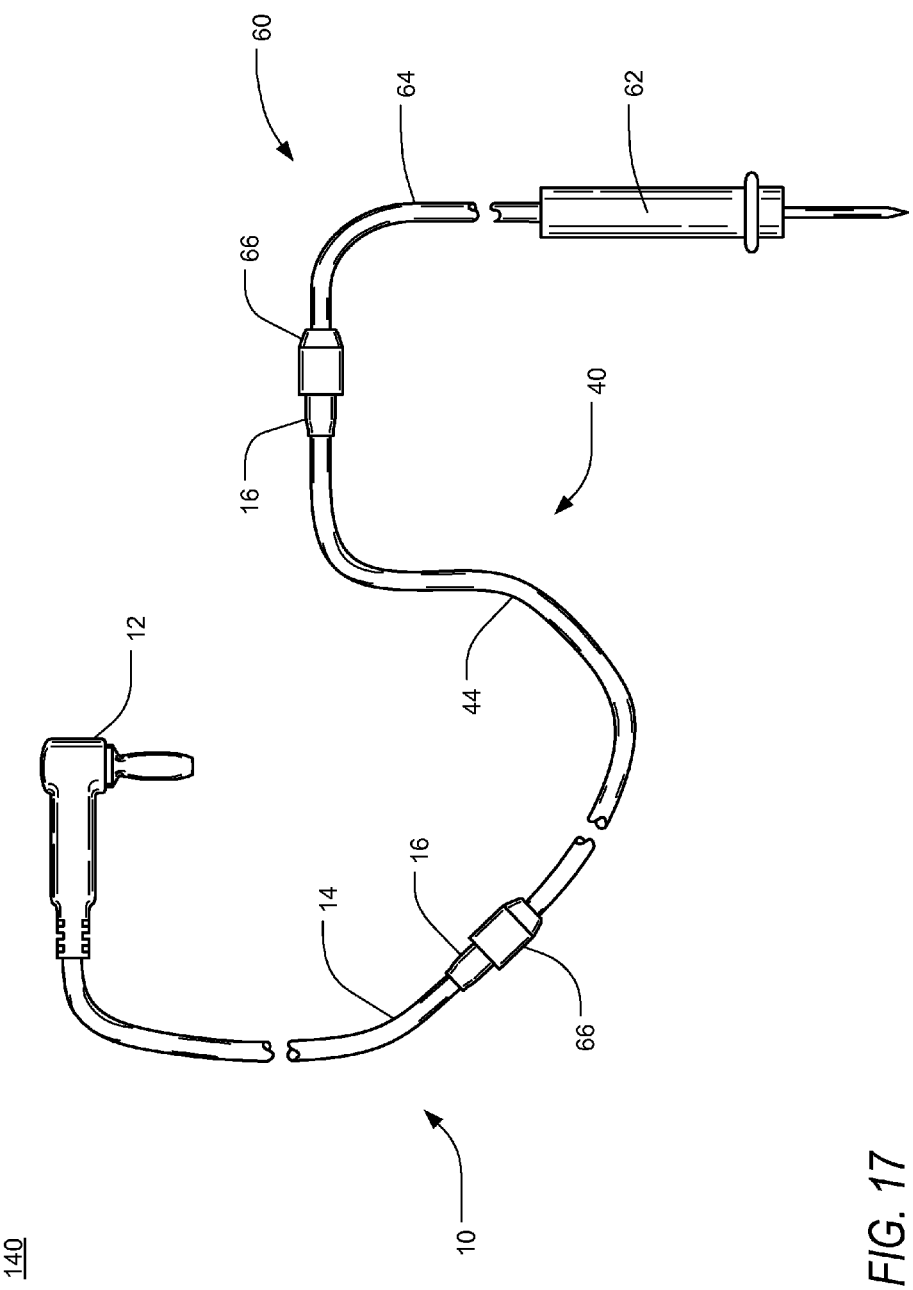
FIG. 17 is a perspective view of the extender of FIG. 16 in use as part of an electrical test lead.

FIG. 17 is a perspective view of the extender 40 of FIG. 16 in use as part of an electrical test lead 140. In the illustrated arrangement, the expanded test lead 140 includes a test lead 10 and test lead adapter 60 like those shown in FIG. 8, but with the test lead extender 40 of FIG. 16 inserted therebetween. In other words, to create the test lead 140 of FIG. 17, the test lead 100 of FIG. 8 has been separated into its primary components (i.e., a basic test lead 10 and a test lead adapter 60), the probe of the basic test lead 10 has been connected to the probe 66 at the proximal end of the test lead extender 40, and the probe 66 at the proximal end of the test lead adapter 60 has been connected to the probe 16 at the distal end of the test lead extender 40. The result is similar in function and purpose to the test lead 100 of FIG. 8, but is longer than that test lead 100. In other words, the length of the test lead 100 of FIG. 8 has been extended, by inserting the test lead extender 40, to produce the test lead 140 of FIG. 17.

Notably, the extender 40 may be used to extend any of the various two-part test leads described and illustrated herein, provided that the magnetic polarities of the respective probes 16,66 of the extender 40 are arranged to permit corresponding magnetic attraction to the probes or other connectors with which they are intended to be coupled. Further, more than one extender 40 may be used in at least some preferred embodiments to provide still greater test lead length. Still further, the extender may be used with only a basic test lead 10,110 (i.e., use of a test lead adapter 60,160 is not required). Still further, each extender can itself function as a test lead (provided the test instrument 30 is of a type that permits magnetic connection thereto).

It will be apparent that the various configurations and arrangements shown herein are merely exemplary of the possible configurations and arrangements possible by combining different electrical connectors, magnetic probes, test lead adapters and test lead extenders, together with conventional test leads, to produce convertible and non-convertible test leads, all without departing from the scope of the present invention.

Figure 18:
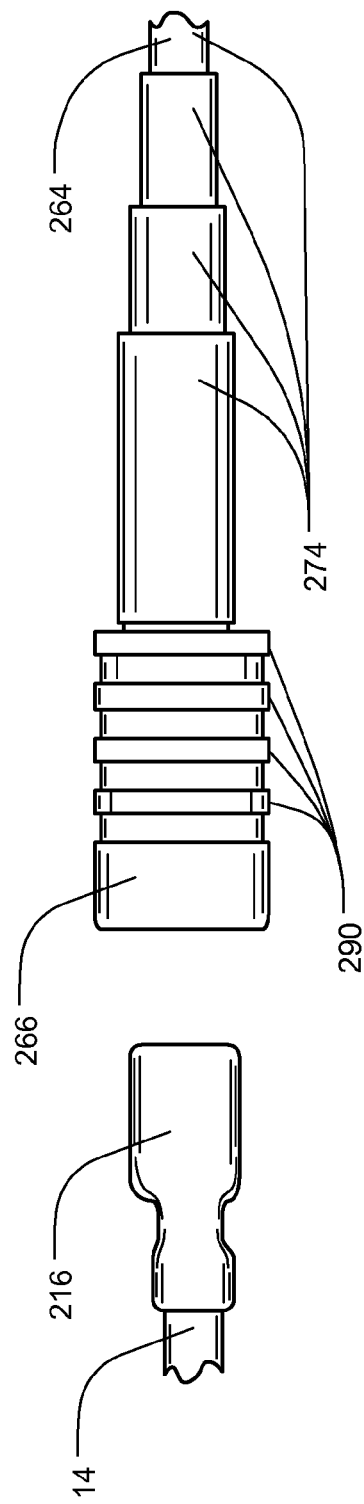
FIG. 18 is a side perspective view of a magnetic coupling, using two magnetic probes, shown in a disengaged state, in accordance with yet another preferred embodiment of the present invention.

FIG. 18 is a side perspective view of a magnetic coupling, using two magnetic probes 216, 266, shown in a disengaged state, in accordance with yet another preferred embodiment of the present invention. As shown therein, one or more of the probes 266 may be provided with ridges 290 or other textures to make it easier to grip the probe 266. Further, the connection of either probe 266 to an electrical cable 264 may be further reinforced using multiple insulation layers 274. The arrangement of FIG. 18 also illustrates the use of probes 216, 266 of two different sizes but whose magnetic cores flush-fit against each other. Other features known to the Ordinary Artisan for use with conventional connectors and other fittings on electrical cables will likewise be apparent and may be likewise applied to the magnetic probes of the present invention.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. An electrical test lead comprising:
an insulated electrical cable having a proximal end and a distal end;
an electrical connector disposed at the proximal end of the cable;
a first electrically conductive magnetic probe disposed at the distal end;
an additional electrical test lead component having a proximal end and a distal end, the proximal end being electrically connected and magnetically attached to the first electrically conductive magnetic probe and extending therefrom, and the distal end being adapted to electrically connect to a test point of a piece of equipment to be tested; and
a second electrically conductive magnetic probe is disposed at the distal end of the additional electrical test lead component; said second electrically conductive magnetic probe electrically connected to a test point of a piece of equipment to be tested.

2. An electrical test lead, comprising:
an insulated electrical cable having a proximal end and a distal end;
an electrical connector disposed at the proximal end of the cable
an electrically conductive magnetic probe disposed at the distal end; and
an additional electrical test lead component having a proximal end and a distal end, the proximal end of the additional electrical test lead component being magnetically attached and electrically connected to the electrically conductive magnetic probe and extending therefrom, and the distal end of the additional electrical test lead component having a non-magnetic test probe to electrically connect to a test point of a piece of equipment to be tested.

3. An electrical test lead, comprising:
an insulated electrical cable having a proximal end and a distal end;
an electrical connector disposed at the proximal end of the cable;
an electrically conductive magnetic probe disposed at the distal end; and
an additional electrical test lead component having a proximal end and a distal end, the proximal end of the additional electrical test lead component being magnetically attached and electrically connected to the electrically conductive magnetic probe and extending therefrom, and the distal end of the additional electrical test lead component having a non-magnetic alligator clip to electrically connect to a test point of a piece of equipment to be tested.

4. An electrical test lead, comprising:
an insulated electrical cable having a proximal end and a distal end;
an electrical connector disposed at the proximal end of the cable;
an electrically conductive magnetic probe disposed at the distal end; and
an additional electrical test lead component having a proximal end and a distal end, wherein a magnetic core, comprising a piece of magnetic material to which an electrically conductive metallic coating is applied, is disposed at the proximal end of the electrical test lead component, the magnetic core being magnetically attached and electrically connected to the electrically conductive magnetic probe and extending therefrom.

5. An electrical test lead, comprising:
an insulated electrical cable having a proximal end and a distal end;
an electrical connector disposed at the proximal end of the cable;
an electrically conductive magnetic probe disposed at the distal end; and
an additional electrical test lead component having a proximal end and a distal end, wherein a ferrous metal slug that is adapted to magnetically attach to the electrically conductive magnetic probe is disposed at the proximal end of the electrical test lead component, the magnetic core being magnetically attached and electrically connected to the electrically conductive magnetic probe and extending therefrom.

* * * * *